US011085953B2

(12) United States Patent
Grigorov et al.

(10) Patent No.: US 11,085,953 B2
(45) Date of Patent: Aug. 10, 2021

(54) HALF-BRIDGE DIFFERENTIAL SENSOR

(71) Applicant: Melexis Technologies NV, Tessenderlo (BE)

(72) Inventors: Asparuh Ivanov Grigorov, Sofia (BG); Johan Vergauwen, Kruibeke (BE)

(73) Assignee: MELEXIS TECHNOLOGIES NV, Tessenderlo (BE)

( * ) Notice: Subject to any disclaimer, the term of this patent is extended or adjusted under 35 U.S.C. 154(b) by 183 days.

(21) Appl. No.: 16/512,526

(22) Filed: Jul. 16, 2019

(65) Prior Publication Data
US 2020/0018781 A1  Jan. 16, 2020

(30) Foreign Application Priority Data

Jul. 16, 2018 (EP) .................................... 18183665

(51) Int. Cl.
*G01R 17/10* (2006.01)
*G01R 19/00* (2006.01)
*G01R 31/28* (2006.01)

(52) U.S. Cl.
CPC ....... *G01R 17/105* (2013.01); *G01R 19/0092* (2013.01); *G01R 31/2829* (2013.01)

(58) Field of Classification Search
None
See application file for complete search history.

(56) References Cited

U.S. PATENT DOCUMENTS

| 6,433,524 | B1* | 8/2002 | Yang ................... G01R 17/105 323/274 |
| 6,765,391 | B2 | 7/2004 | Corkum et al. |
| 2015/0293155 | A1* | 10/2015 | Joet .................... G01R 19/0084 324/706 |
| 2015/0311353 | A1* | 10/2015 | Van Der Wiel ....... G01L 9/0055 73/862.629 |

(Continued)

OTHER PUBLICATIONS

Xu et al., "A Temperature Compensation Algorithm of Piezoresistive Pressure Sensor and Software Implementation," Proceedings of 2013 IEEE International Conference on Mechatronics and Automation, Aug. 4-7, 2013, Takamatsu, Japan, pp. 1738-1742.

(Continued)

*Primary Examiner* — Nasima Monsur
(74) *Attorney, Agent, or Firm* — Workman Nydegger

(57) ABSTRACT

The present invention relates to a half-bridge signal processing circuit comprising a first and a second branch. The first branch comprises a first stimulus responsive sense element and a first current source arranged to provide a current to the first sense element. The second branch comprises a second stimulus responsive sense element and a second current source arranged to provide a current to said second sense element. The first and the second branch have a terminal in common. The first branch comprises a first node between said the current source and the first stimulus responsive sense element configured to generate a first signal related to a voltage over the first sense element. The second branch comprises a second node between the second (Continued)

current source and the second stimulus responsive sense element configured to generate a second signal related to a voltage over the second sense element.

12 Claims, 6 Drawing Sheets

(56) References Cited

U.S. PATENT DOCUMENTS

2018/0292933 A1* 10/2018 Hu .......................... G01L 1/205

OTHER PUBLICATIONS

Manguo et al., "Design of Temperature Compensation for Silicon-Sapphire Pressure Sensor," IEEE Int'l Conf. on Imaging Systems and Techniques 2017, Oct. 18-20, 2017, 5 pgs.
Idzkowski et al., "Analysis and Application of Two-Current-Source Circuit as a Signal Conditioner for Resistive Sensors," Journal of Electrical Engineering, vol. 68, No. 3, Jan. 1, 2017, pp. 200-205.
European Search Report for EP Application No. 18183665.1, dated Jan. 8, 2019.

* cited by examiner

HALF-BRIDGE DIFFERENTIAL SENSOR

FIELD OF THE INVENTION

The present invention is generally related to the field of half-bridge circuits as used in sensors for monitoring an applied stimulus such as pressure, force, acceleration and the like.

BACKGROUND OF THE INVENTION

A sensor of the type considered in this invention is used, for example, in an automotive application for monitoring an applied stimulus, such as pressure (e.g. brake fluid pressure, exhaust gas pressure or cylinder pressure), force, acceleration and the like and, as in the case of a pressure sensing application, typically comprises a sense element to provide a signal in response to a target stimulus. A widely applicable electrical representation of such a sensor (e.g. a pressure sensor) is the half-bridge circuit shown in the picture FIG. 1.

The half-bridge circuit of FIG. 1 comprises two serially connected sense elements, represented by their equivalent resistances (Rpos, Rneg). In a nominal condition of the physical magnitude being measured (e.g. zero pressure) and assuming an ideal sensor, these two serial connected sense elements have the same resistance value. When the physical magnitude changes from that nominal condition, one of the resistances increases proportionally (Rpos in FIG. 1) and the other (Rneg) decreases proportionally. In the case of a pressure sensor the half-bridge circuit behaviour vs the measured pressure can be described by the following equations:

$$R_{pos} = Rb*(½ + ((P/Pfs)*Sens) + Offs)$$

$$R_{neg} = Rb*(½ - ((P/Pfs)*Sens) - Offs) \quad (1)$$

where Rb (=Rpos+Rneg) denotes the equivalent half-bridge resistance, Pfs the full scale pressure value, P the measured pressure, Sens the sensor sensitivity and Offs the sensor offset. The equations (1) are derived from the physics of the sensor and from customer specifications. The equations (1) are valid only if the bridge resistance (Rpos+Rneg) is independent from the applied pressure. Otherwise, the Rpos and the Rneg have a non-linear dependence on the pressure. In most real sensors that non-linearity is however negligible and therefore it is omitted from the discussions below.

When using this type of sensors, the difficulty is in finding the optimal driving and signal read-out circuits. Ideally the circuits should have a differential output signal (in order to obtain a better noise, power supply rejection ratio (PSRR) and electromagnetic compatibility (EMC) performance) and a life-time stable driving capability.

A differential output signal is available intrinsically if a full-bridge sensor is used. However, the use of a half-bridge circuit may be preferred because of its lower cost and smaller physical dimensions. Hence, there is interest in finding a differential signal solution comprising a half-bridge circuit.

A typical application connection of such sensor includes voltage source driving of the entire half-bridge as shown in FIG. 2 (node Vsupply in FIG. 2). The output is taken as a single ended node Vout. Further signal processing with the single ended output cannot achieve the noise, PSRR and EMC performance requirements that are typically needed.

Therefore an output differential signal is formed as shown in FIG. 3. The output differential signal is formed as the difference between the sensor single ended output node Vsensor and a portion of the supply voltage K*Vsupply formed by e.g. resistor division. This approach is adopted in U.S. Pat. No. 6,765,391.

However, several problems remain unsolved with this approach. First, the formation of a voltage K*Vsupply proportional to the supply voltage may be done by resistance division (as in FIG. 3), but then a parallel branch connected to the half-bridge supply (Vsupply in FIG. 3) is affecting the total resistance. For many pressure sensors the equivalent half-bridge resistance changes over temperature and is used as input for temperature signal processing and the resulting output signal is further used for correcting the pressure processing characteristics (like e.g. gain and offset) over temperature. Further, the portion K*Vsupply may be obtained through buffering prior to the resistor division. In this case the offset and life time stability of the applied buffer limit the performance of the sensor signal processing. Another problem is that any life-time change of the supply voltage affects the magnitude of the output differential voltage, limiting the life-time performance of the sensor signal processing.

Hence, there is a need for a half-bridge circuit wherein these drawbacks are reduced or even overcome.

SUMMARY OF THE INVENTION

It is an object of embodiments of the present invention to provide for a half-bridge signal processing circuit wherein one or more of the above-mentioned drawbacks are avoided or reduced.

The above objective is accomplished by the solution according to the present invention.

In a first aspect the invention relates to a half-bridge signal processing circuit comprising a first and a second branch. The first branch comprises a first stimulus responsive sense element and a first current source arranged to provide a current to the first sense element. The second branch comprises a second stimulus responsive sense element and a second current source arranged to provide a current to the second sense element, whereby the first and the second branch have a terminal in common. The first branch comprises a first node between the first current source and the first stimulus responsive sense element configured to generate a first signal related to a voltage over the first sense element and the second branch comprises a second node between the second current source and the second stimulus responsive sense element configured to generate a second signal related to a voltage over the second sense element. A differential output voltage signal is obtained from the difference between the first and the second signal.

The proposed solution indeed allows for meeting the requirements as set out above. The proposed circuit yields a differential output signal, obtained via said first and second signal.

In a preferred embodiment the first and second current source are adaptive.

In embodiments of the invention the half-bridge signal processing circuit comprises a read-out unit arranged for receiving the first and the second signal and for reading out a common mode voltage derived from the first and second signal. Advantageously, the circuit then also comprises a feedback control unit arranged for receiving said common mode voltage and an indication of a target range for the common mode voltage, and for producing a feedback control signal to the first and second current source. The feedback control signal is determined based on a comparison of the common mode voltage and the target range.

In preferred embodiments the half-bridge signal processing circuit is arranged for determining a ratio of the differential output voltage signal to a common mode voltage derived from the first and the second signal. Advantageously, the circuit comprises a calculation means to calculate said ratio. This calculation means can be implemented in hardware or in software.

In certain embodiments the half-bridge signal processing circuit is arranged to use a common mode voltage derived from the first and the second signal as a reference voltage.

In another preferred embodiment the half-bridge signal processing circuit comprises in a further branch a reference resistor and a further current source arranged to provide current to the reference resistor, whereby the further branch comprises a further node between the further current source and the reference resistor configured to output a further signal representing a voltage over the reference resistor.

In another embodiment the further current source is arranged to also receive the feedback control signal.

In embodiments of the invention a half-bridge equivalent resistance formed by the first and said second stimulus responsive sense elements, is temperature dependent.

In a further embodiment the half-bridge signal processing circuit is arranged to compute a ratio of the further signal (Vint) to the sensor common mode output voltage.

In embodiments of the invention the circuit comprises a filter for filtering the common mode voltage, so that the impact of noise is reduced.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, wherein like reference numerals refer to like elements in the various figures.

DETAILED DESCRIPTION OF ILLUSTRATIVE EMBODIMENTS

Figure 1:
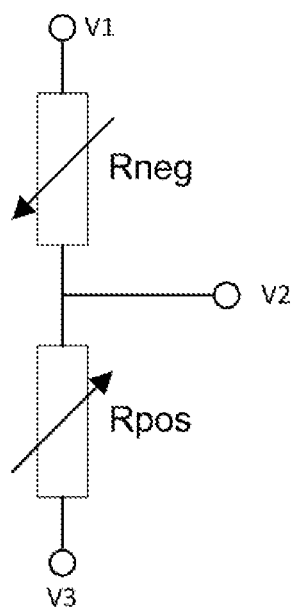
FIG. 1 illustrates a conventional representation of a half-bridge circuit.
Figure 2:
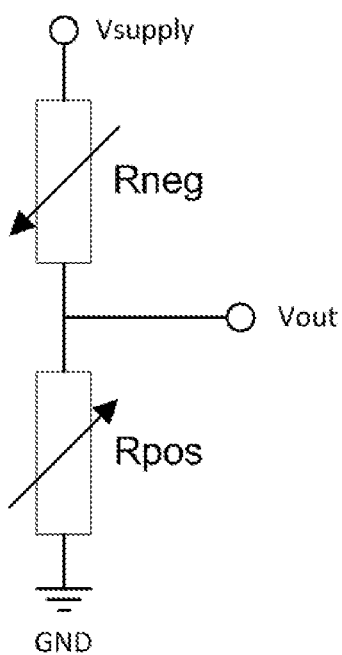
FIG. 2 illustrates the typical connections of such a conventional half-bridge circuit.
Figure 3:
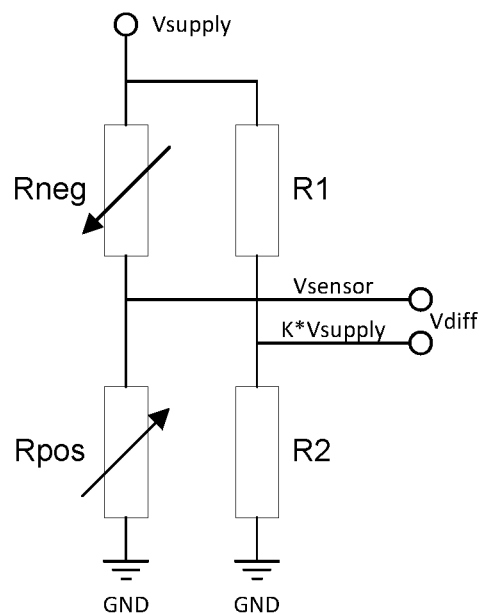
FIG. 3 illustrates a prior art half-bridge circuit arranged to output a differential signal.

The present invention will be described with respect to particular embodiments and with reference to certain drawings but the invention is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

Figure 4:
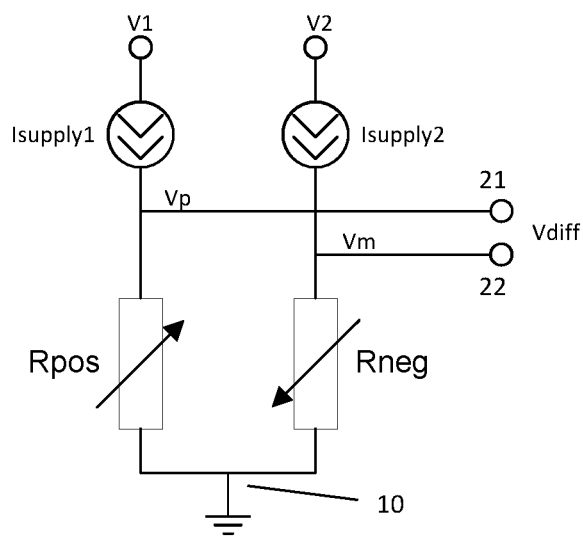
FIG. 4 illustrates a scheme of a half-bridge circuit according to the invention.

The present invention proposes a novel approach for connecting and driving a half-bridge sensor. FIG. 4 illustrates a half-bridge circuit according to an embodiment of the invention. The circuit comprises two branches which at one end receive a respective voltage supply signal (V1, V2) as a stimulus signal. At the other end both branches are connected at terminal 10 to a common potential, which in certain embodiments can be ground potential. Each branch is provided with a stimulus responsive bridge element. These elements have nominally equal stimulus sensitivities of opposite sign. The two stimulus responsive bridge elements at the other end of the first and second branch, respectively, have the terminal 10 in common to connect to that common potential as illustrated in FIG. 4. In the embodiment of FIG. 4 the bridge elements are resistors denoted Rpos and Rneg, respectively. When an identical stimulus signal is applied, the resistance of Rpos in the first branch increases with a certain amount, while the resistance of the resistor Rneg in the other path decreases over substantially the same amount. A current source (Isupply1) is arranged to apply current to the half-bridge circuit branch comprising Rpos. A voltage drop Vp over the bridge element Rpos is thereby produced. Similarly, another current source (Isupply2) feeds a current to the branch containing Rneg, thereby producing a voltage drop Vm over the bridge element Rneg. In this manner the half-bridge circuit provides intrinsically a differential output voltage signal (Vdiff) via the difference between the voltages Vp and Vm obtained at terminals 21 and 22, respectively.

Figure 5:
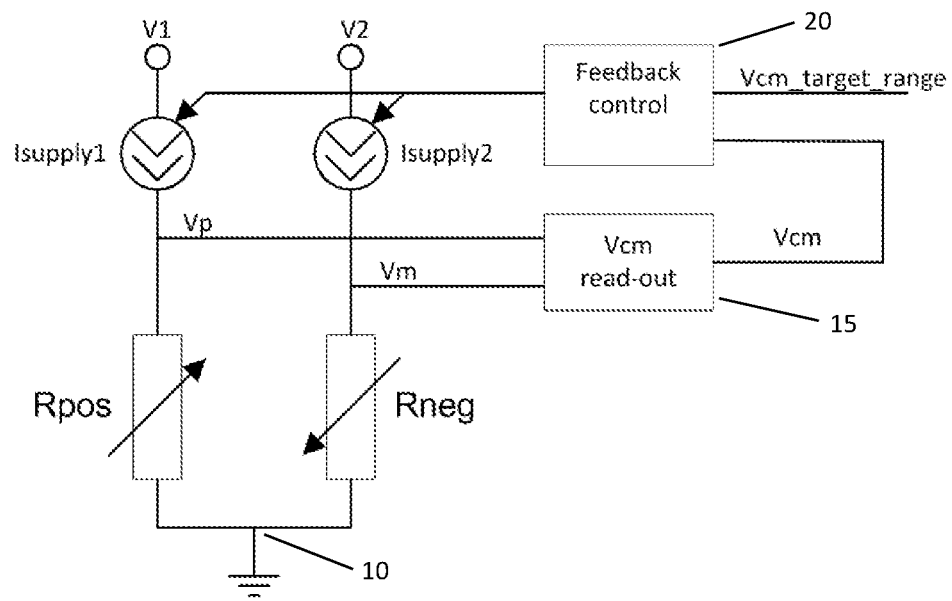
FIG. 5 illustrates an embodiment with a read-out circuit and a feedback loop.

In the embodiment shown in FIG. 5 the half-bridge circuit is arranged for performing sensor output common mode voltage control. A sensor output common mode voltage read-out circuit (15) is added to the half-bridge circuit. The read-out circuit takes as input the voltages Vp and Vm and outputs a read-out common mode voltage Vcm=(Vp+Vm)/2. This common-mode voltage is next fed to a feedback control unit (20). The feedback control unit also receives as an input a target range for the common mode voltage. Alternatively, the feedback control unit contains a predetermined set of suitable values for the common mode voltage. The feedback control unit controls if the common mode voltage falls within the target range. If needed, the values of the supply current sources are adjusted to bring the common mode voltage within its target range.

The magnitude of the physical quantity (e.g. pressure) can be determined by processing the ratio of the sensor differential output voltage Vdiff over the sensor common mode output voltage Vcm. This can be shown with the following equations, whereby expressions (1) are exploited $$\begin{aligned} Vdiff &= Vp - Vm \\ &= Isupply1*Rpos - Isupply2*Rneg \\ &= Isupply1*[Rb*(1/2+((P/Pfs*Sens)+Offs)] - \\ &\quad Isupply2*[Rb*(1/2-((P/Pfs*Sens)-Offs)] \end{aligned}$$

Dynamic element matching techniques (such as at least two-phase chopping) can be used, which allows assuming the two supply current sources Isupply1 and Isupply2 to be equal. Taking two-phase chopping as an example, there are two commutation phases. In phase 1 current from Isupply1 goes through sense element 1 and current from Isupply2 goes through sense element 2. In phase 2 Isupply2 goes through sense element 1 and Isupply1 goes through sense element 2. The samples of the two phases are then averaged. Thus, if Isupply1=I and Isupply2=I+ε the sample values in the two phases can be expressed as:

Sample_Vdiff_phase1=Rpos*I−Rneg*(I+ε)

Sample_Vdiff_phase2=Rpos*(I+ε)−Rneg*I

Sample_Vcm_phase1=Rpos*I+Rneg*(I+ε)

Sample_Vcm_phase2=Rpos*(I+ε)+Rneg*I

For the ratio Pratio=Vdiff/Vcm one obtains:

Pratio=(Sample_Vdiff_phase1+Sample_Vdiff_phase2)/(Sample_Vcm_phase1+Sample_Vcm_phase2)=(Rpos−Rneg)/(Rpos+Rneg)=2*[(P/Pfs)*Sens+Offs]

In case another dynamic element matching technique is applied, the assumption Isupply1=Isupply2=I can still be made, leading to:

Pratio=Vdiff/Vcm=(Rpos−Rneg)/(Rpos+Rneg)=2*[(P/Pfs)*Sens+Offs]

Figure 6:
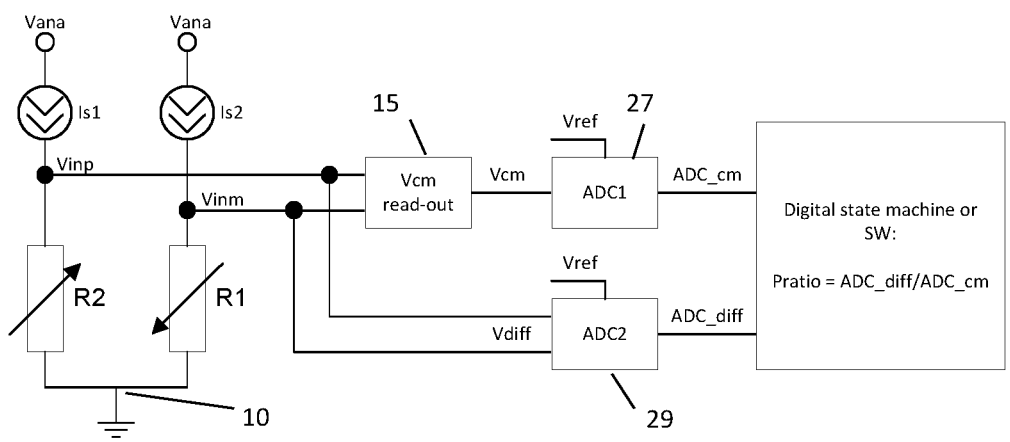
FIG. 6 illustrates one possible way to determine the ratio Vdiff/Vcm.
Figure 7:
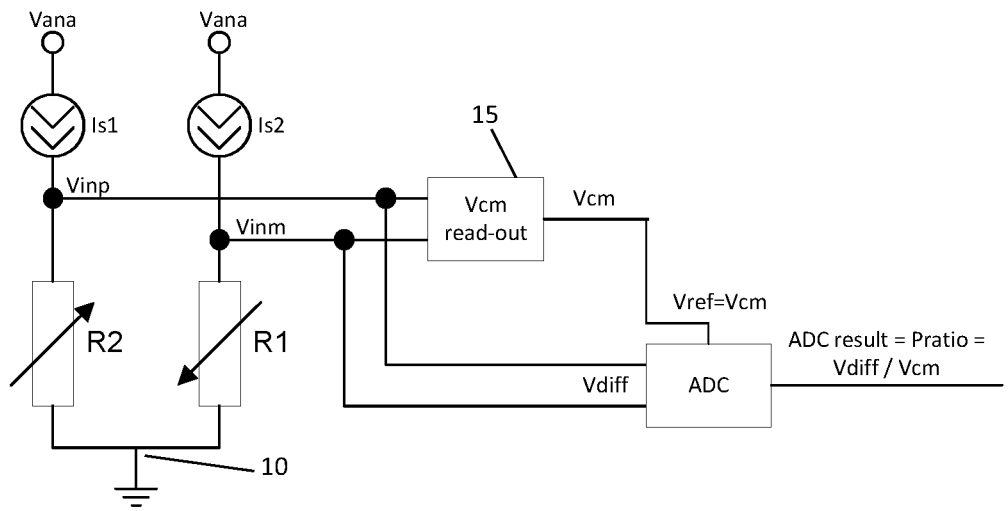
FIG. 7 illustrates an alternative way to determine the ratio Vdiff/Vcm.

Some possible ways to determine the ratio Pratio=Vout/Vcm=Vdiff/Vcm are illustrated in FIGS. 6 and 7, respectively. In FIG. 6 the common mode voltage Vcm is determined in block 15 and processed through block 27 representing an A/D converter (ADC1) with reference voltage Vref. The difference Vdiff between Vinp and Vinm is processed through block 29 comprising another ADC with the same reference voltage Vref. In another embodiment it is processed through the same ADC as used for Vcm, but in a different time period. Again the same reference voltage Vref is used. Next there is in certain embodiments a digital state machine or, in other embodiments, a SW implementation to realize a digital division between the two ADC results yielding the ratio Vdiff/Vcm. In the embodiment shown in FIG. 7 a different approach is adopted: the reference voltage is now equal to Vcm and used to process Vdiff through the ADC. The ADC output directly yields the ratio of interest.

The sensor sensitivity and offset imperfections can be compensated for by applying a calibration. There are many ways to perform such calibration. In one example, four temperatures and two pressures are used. Pressure gain and offset corrections are obtained, compensated with third order over temperature. Temperature compensation techniques that can readily be applied here, are well known in the art, for example in the papers '*A Temperature Compensation Algorithm of Piezoresistive Pressure Sensor and Software Implementation*' (D. Xu et al., Proc. IEEE Conf on Mechatronics and Automation, Aug. 4-7 2013, Takamatsu, Japan) and '*Design of temperature compensation for silicon-sap-*

*phire pressure sensor*' (H. Manguo et al., IEEE Int'l Conf on Imaging Systems and Techniques 2017, 18-20 Oct. 2017).

The signal processing required when using the proposed half-bridge circuit is not sensitive to the imperfections and life-time changes of the sensor supply circuit and the sensor read-out circuit. Due to the use of a differential sensor output signal the circuit is robust against EMC, PSRR and noise as was desired.

In further embodiments the sensor common mode output voltage can be further filtered, without having a big impact on the bandwidth of the processed signal. In this way the noise on the temperature channel during the half-bridge equivalent resistance Rb measurement can be reduced.

Figure 8:
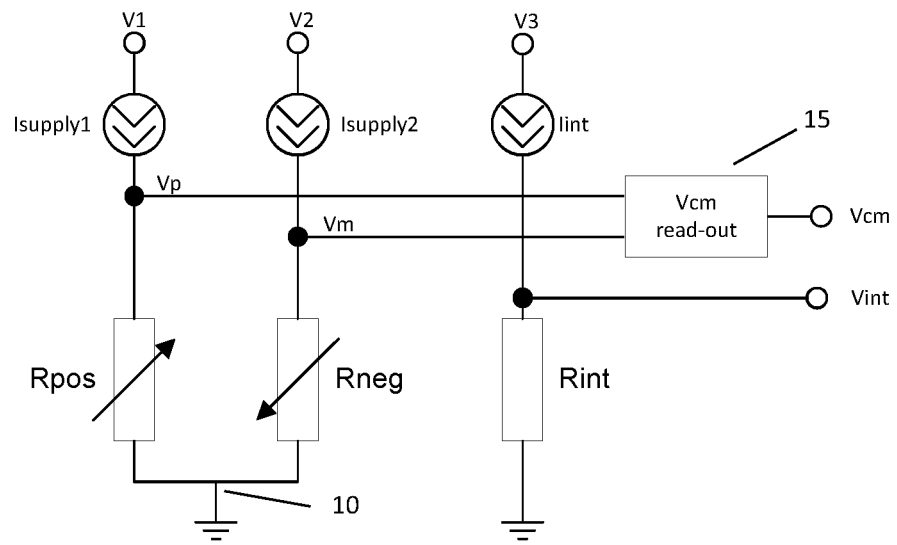
FIG. 8 illustrates an embodiment of the half-bridge circuit of the invention with an additional branch.

In another aspect the invention proposes a solution for the processing of the half-bridge equivalent resistance Rb, which e.g. in a pressure sensor can be dependent on the temperature. The processed temperature can then be used for temperature compensations of the sensor sensitivity and offset. An embodiment of the corresponding half-bridge circuit is illustrated in FIG. 8. There is an additional current source Iint, matched with Isupply1 and Isupply2, which sources current over the reference resistor Rint, thereby producing a voltage drop Vint.

Figure 9:
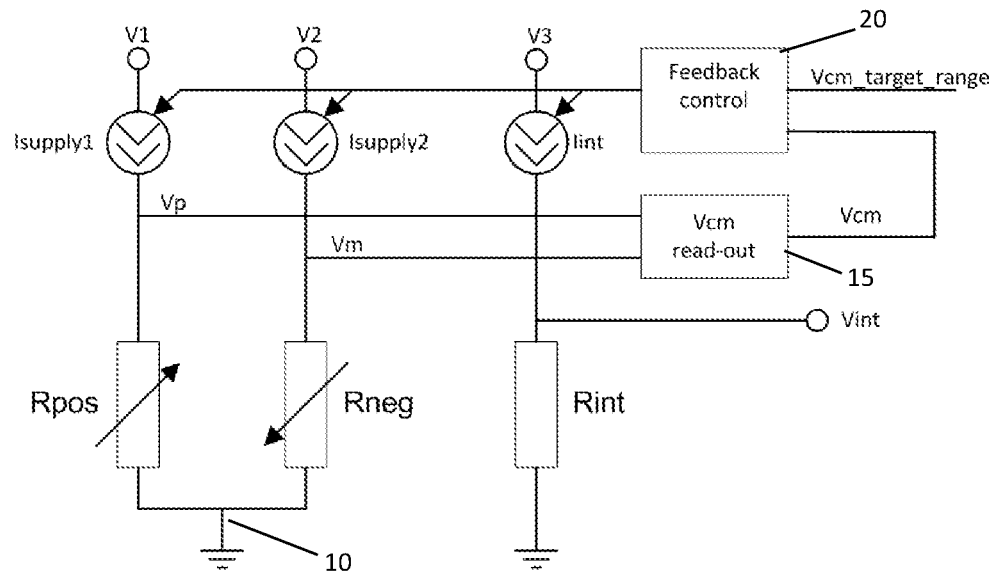
FIG. 9 illustrates an embodiment of the half-bridge circuit of the invention with an additional branch and feedback control block.

A feedback control mechanism can be used to control Isupply1 and Isupply2 together with the matched Iint as described above in order to obtain a relatively stable Vcm over the temperature with Vint changing over the temperature due to the Iint change forced by the feedback control. In this way a bigger magnitude is provided for the Vcm and Vint signals, which is more suitable for further processing. FIG. 9 illustrates such a scheme. If the feedback control mechanism is not used (as e.g. in FIG. 8) and all current sources are stable over the temperature, the Vcm and Vint signal magnitude would be relatively small for low Rb, which in certain conditions can be an obstacle for their further processing.

The ratio (Tratio) of the voltage drop on the internal reference resistor Vint over the sensor common mode output voltage is processed. This can be described as follows:

$$Vint = Iint * Rint$$

$$Vcm = (Vp+Vm)/2 = (Isupply1 * Rpos + Isupply2 * Rneg)/2$$

$$Vcm = (Isupply1 * [Rb*(\tfrac{1}{2}+(P/Pfs*Sens)+Offs)] + Isupply2 * [Rb*(\tfrac{1}{2}-((P/Pfs*Sens)-Offs))])/2$$

Again, optionally dynamic element matching techniques can be applied so that a fixed ratio can be assumed between Iint and Isupply1, Isupply2 noted as Iratio. For Tratio, the ratio of the voltage drop on the internal reference resistor Vint over the sensor common mode output voltage, one can write $$Tratio = Vint/Vcm = Tratio * Rint/(Rb/2)$$

The invention uses calibration for the compensation of the Tratio and Rint imperfections. This signal processing is sensitive only to the life-time changes of the Tratio and Rint.

Figure 10:
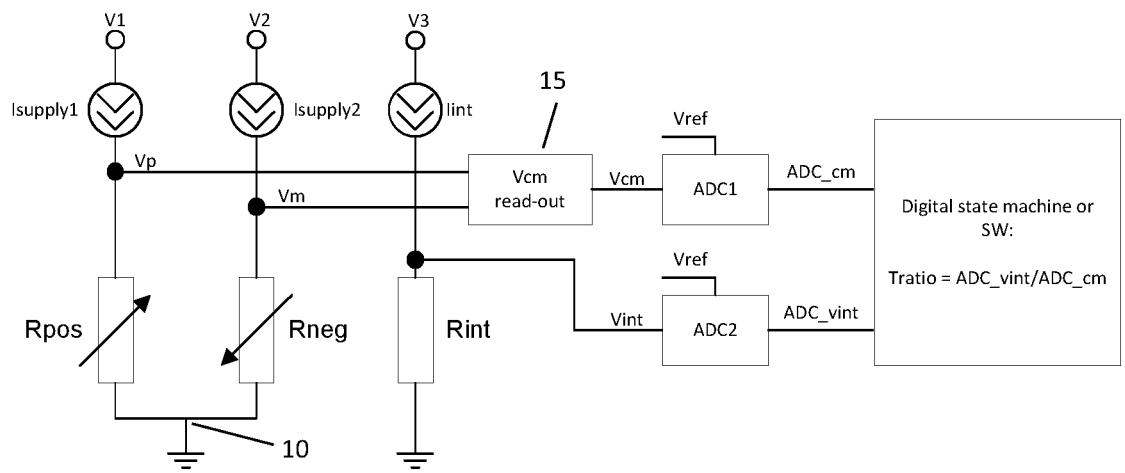
FIG. 10 illustrates a way to determine the ratio Vint/Vcm.
Figure 11:
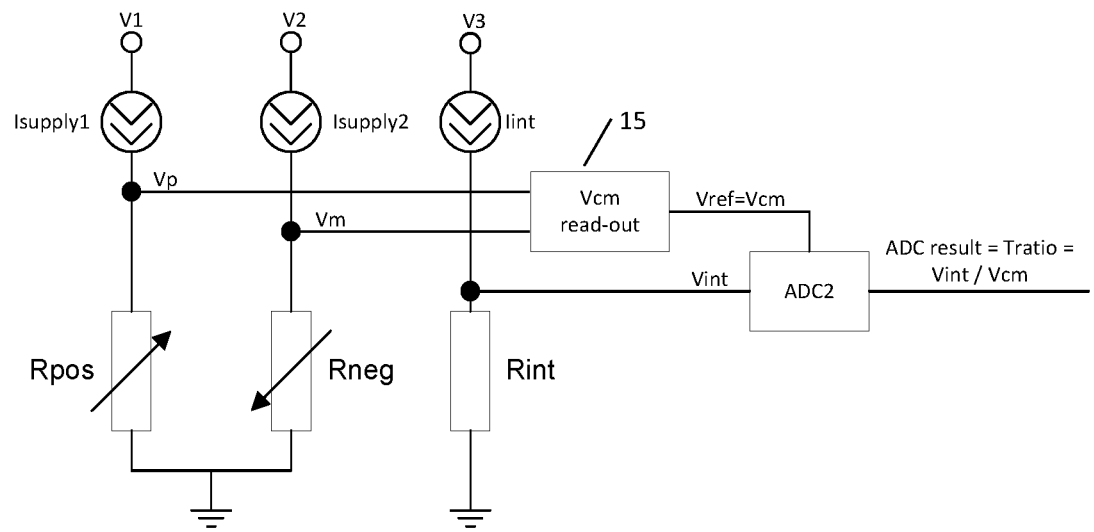
FIG. 11 illustrates another way to determine the ratio Vint/Vcm.

Some possible ways to determine the ratio Tratio=Vint/Vcm are illustrated in FIGS. 10 and 11, respectively. In FIG. 10 the common mode voltage Vcm is determined in block 15 and processed through block 27 representing an A/D converter (ADC1) with reference voltage Vref. The voltage drop over the reference resistor is processed through block 29 comprising another ADC with the same reference voltage Vref. In another embodiment it is processed through the same ADC as used for Vcm, but in a different time period. Again the same reference voltage Vref is used. Next there is in certain embodiments a digital state machine or, in other embodiments, a software implementation to realize a digital division between the two ADC results yielding the ratio Vint/Vcm. In the embodiment shown in FIG. 11 a different approach is adopted: the reference voltage is now equal to Vcm and used to process Vint through the ADC. The ADC output directly yields the ratio of interest.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A signal processing circuit comprising a first and a second branch, wherein said first branch is arranged to receive at one end a first voltage supply signal and comprises a first stimulus responsive sense element and a first current source arranged to provide a current to said first sense element and said second branch is arranged to receive at one end a second voltage supply signal and comprises a second stimulus responsive sense element and a second current source arranged to provide a current to said second sense element, whereby said first stimulus responsive sense element at the other end of said first branch and said second stimulus responsive sense element at the other end of said second branch have a terminal in common to connect to a common potential, and whereby said first branch comprises a first node between said first current source and said first stimulus responsive sense element configured to generate a first signal related to a voltage over said first sense element, whereby said second branch comprises a second node between said second current source and said second stimulus responsive sense element configured to generate a second signal related to a voltage over said second sense element, and wherein a differential output voltage signal is obtained from the difference between said first and said second signal;

wherein a read-out circuit is arranged for receiving said first and said second signal and for reading out a common mode voltage derived from said first and said second signal;

wherein a feedback control unit is arranged for receiving said common mode voltage and an indication of a target range for said common mode voltage, and for producing a feedback control signal to said first and said second current source.

2. The signal processing circuit as in claim 1, wherein said first and said second current source are adaptive.

3. The signal processing circuit as in claim 1, wherein said feedback control signal is determined based on a comparison of said common mode voltage and said target range.

4. The signal processing circuit as in claim 1, arranged for determining a ratio of said differential output voltage signal to said common mode voltage derived from said first and said second signal.

5. The signal processing circuit as in claim 4, comprising a calculation means to calculate said ratio.

6. The signal processing circuit as in claim 1, arranged to use said common mode voltage derived from said first and said second signal as a reference voltage.

7. The signal processing circuit as in claim 1, comprising in a further branch a reference resistor and a further current source arranged to provide current to said reference resistor, whereby said further branch comprises a further node between said further current source and said reference resistor configured to output a further signal representing a voltage over said reference resistor.

8. The signal processing circuit as in claim 7, wherein said further current source arranged to receive said feedback control signal.

9. The signal processing circuit as in claim 8, arranged to compute a ratio of said further signal to said common mode voltage.

10. The signal processing circuit as in claim 1, wherein a half-bridge equivalent resistance formed by said first and said second stimulus responsive sense elements, is temperature dependent.

11. The signal processing circuit as in claim 1, comprising a filter for filtering said common mode voltage.

12. A signal processing circuit comprising a first and a second branch, wherein said first branch is arranged to receive at one end a first voltage supply signal and comprises a first stimulus responsive sense element and a first current source arranged to provide a current to said first sense element and said second branch is arranged to receive at one end a second voltage supply signal and comprises a second stimulus responsive sense element and a second current source arranged to provide a current to said second sense element, whereby said first stimulus responsive sense element at the other end of said first branch and said second stimulus responsive sense element at the other end of said second branch are directly connected to a common terminal to connect to a common potential, and whereby said first branch comprises a first node between said first current source and said first stimulus responsive sense element configured to generate a first signal related to a voltage over said first sense element, whereby said second branch comprises a second node between said second current source and said second stimulus responsive sense element configured to generate a second signal related to a voltage over said second sense element, and wherein a differential output voltage signal is obtained from the difference between said first and said second signal;

wherein a read-out circuit is arranged for receiving said first and said second signal and for reading out a common mode voltage derived from said first and said second signal;

wherein a feedback control unit is arranged for receiving said common mode voltage and an indication of a target range for said common mode voltage, and for producing a feedback control signal to said first and said second current source.

* * * * *